(12) United States Patent
Wang (10) Patent No.: US 7,830,776 B2
(45) Date of Patent: Nov. 9, 2010

(54) DEVICE FOR POSITIONING, TRANSFERRING AND RECORDING INTEGRATED CIRCUITS

(75) Inventor: An-Sung Wang, Taipei Hsien (TW)

(73) Assignee: Leap Electronic Co., Ltd., Sanchong City, Taipeic County (TW)

( * ) Notice: Subject to any disclaimer, the term of this patent is extended or adjusted under 35 U.S.C. 154(b) by 1011 days.

(21) Appl. No.: 11/604,146

(22) Filed: Nov. 27, 2006

(65) Prior Publication Data

US 2008/0123510 A1    May 29, 2008

(51) Int. Cl.
*G11B 3/00* (2006.01)
*B25J 9/10* (2006.01)
(52) U.S. Cl. ........................................ 369/127; 414/590
(58) Field of Classification Search ................... 369/127
See application file for complete search history.

(56) References Cited

U.S. PATENT DOCUMENTS 4,119,211 A * 10/1978 Boyer et al. ................ 414/591
5,086,559 A * 2/1992 Akatsuchi ..................... 29/834
5,953,812 A * 9/1999 Ferrante ....................... 29/714
6,279,225 B1 * 8/2001 Martin et al. ................. 29/740

* cited by examiner

*Primary Examiner*—Craig A. Renner
*Assistant Examiner*—Tamara Ashford (57) ABSTRACT

An IC recording device includes a material feeding portion, a material receiving portion, a recording portion and a transferring portion. The material feeding portion serves to suck ICs by vacuum technology to take ICs from a transfer belt and place them upon the material receiving portion. The material receiving portion can correct the positions of the ICs. The inner side of a seat of the material receiving portion has an inclined surface for guiding the ICs. The seat can rotate the IC to a correct direction according to the transferring angle of the IC in the feeding process. One of two ends of the material feeding portion has a suction opening for transferring the IC from the material receiving portion to a burner and the suction opening at another end serves to take out a recorded IC and place the IC on a transfer belt.

4 Claims, 10 Drawing Sheets

DEVICE FOR POSITIONING, TRANSFERRING AND RECORDING INTEGRATED CIRCUITS

FIELD OF THE INVENTION

The present invention relates to burners, and particularly to an IC recording device, wherein a material feeding portion serves to place un-recorded ICs to a material receiving portion which can automatically adjust the orientation of the IC (Integrated Circuit). Two ends of the material feeding portion have suction openings. One end thereof serves for locating the IC to a burner and another end thereof serves to transfer a recorded IC to a transfer belt.

BACKGROUND OF THE INVENTION

In the prior art IC recording device, the robust arm for locating an IC are moved in a coordinate formed by an X axis and a Y axis for performing horizontal positioning operations. Then the arm is located vertically along a coordinate formed by the Y axis and the Z axis. The above mentioned processes for XY coordinate and YZ coordinate are performed repeatedly. The processes for different coordinates can not be performed at the same time. This has deeply affected the manufacturing process. The prior art burner uses image devices for detecting the position alignment of an IC before transferring to a burner. Thus the components for the Z axis become complicated and the torques in the X and Y axis are great. Thereby the manufacturing cost is high. Thus, in the prior art burners, the processes of material feeding, recording and transferred need to be improved.

SUMMARY OF THE INVENTION

Accordingly, the primary object of the present invention is to provide an IC recording device, wherein the processes of material feeding, recording and transferring are integrated. A rotary arm is used to improve the prior art straight line movements so as to achieve the object of automatic control.

To achieve the above objects, the present invention provides an IC recording device. The device comprises a material feeding portion having a suction nozzle for taking an un-burned IC from a transfer belt by vacuum suction. The suction nozzle is movable for sucking an IC or placing an IC. The material feeding portion is movable transversally by using a servo motor below a working platform to drive a belt; and thus an un-burned IC can be moved to a material receiving portion. The material receiving portion has a material receiving seat thereon. An inner side of the material receiving seat has an inward sloped inclined surface for guiding an IC to a predetermined position. The material receiving portion is rotatable for correcting the direction of the IC. If the IC is placed incorrectly, the material receiving seat will rotate to correct the direction of the IC so as to assure that the pins of the IC in the burner are correctly arranged. A rotary arm is installed aside the material receiving portion. The burners serves for locating an IC; and the pressing plates serves for pressing the burners. A rotary arm is driven by a servo motor. Two ends of the rotary arm has a first material transfer suction opening and a second material transfer suction opening. When an IC is placed upon a material receiving seat, the first material transfer suction opening of the rotary arm will rotate toward the material receiving seat for sucking an un-recorded IC. The material feeding portion will move rightwards for sucking another un-recorded IC. When the first material transfer suction opening sucks an un-recorded IC, the material feeding portion will move to the upper side of the material receiving seat and place the IC on the suction opening to the material receiving seat. The process is repeated continuously until every burner on one side has located an IC for recording by using the first material transfer suction opening. At the time that the first material transfer suction opening sucks an IC for locating the IC at another side, the second material transfer suction opening at another end of the rotary arm sucks a recorded IC and the first material transfer suction opening re-sucks an IC on the material receiving seat. The recorded IC is placed upon a transfer belt. The operations of recording and transferring are performed repeatedly.

The various objects and advantages of the present invention will be more readily understood from the following detailed description when read in conjunction with the appended drawings.

BRIEF DESCRIPTION OF THE DRAWINGS

FIGS. 3-1 shows the second operation of the rotary arm of the IC recording device according to the present invention.

FIGS. 3-2 shows the third operation of the rotary arm of the IC recording device according to the present invention.

FIGS. 3-3 shows the fourth operation of the IC recording device according to the present invention.

FIGS. 3-4 shows the fifth operation of the IC recording device according to the present invention.

FIGS. 4-1 is a schematic view showing a second clamping operation of the burner of the IC recording device according to the present invention.

DETAILED DESCRIPTION OF THE INVENTION

In order that those skilled in the art can further understand the present invention, a description will be provided in the following details. However, these descriptions and the appended drawings are only used to cause those skilled in the art to understand the objects, features, and characteristics of the present invention, but not to be used to confine the scope and spirit of the present invention defined in the appended claims.

Figure 1:
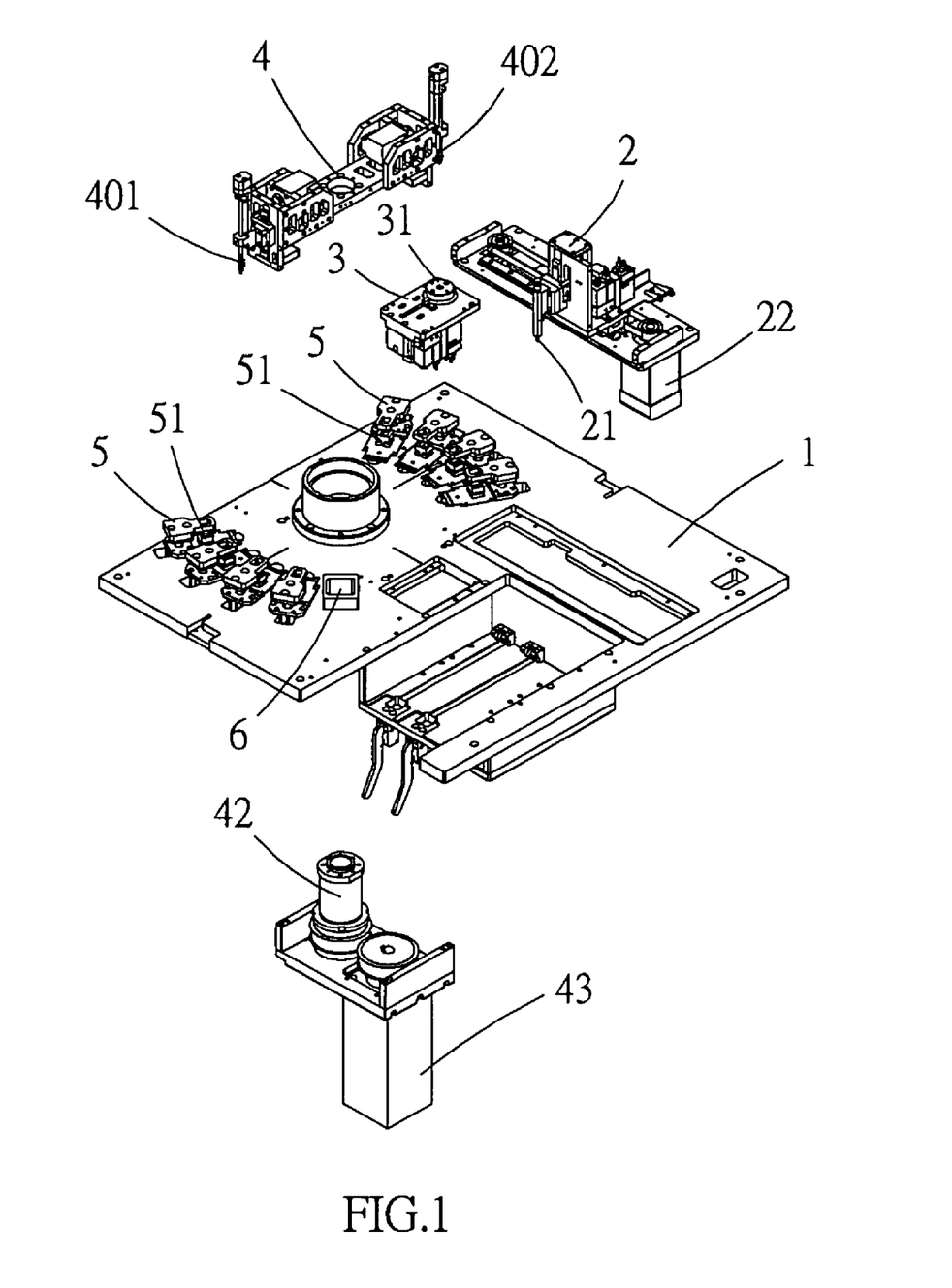
FIG. 1 is an exploded view of the waste frame of the present invention.
Figure 2:
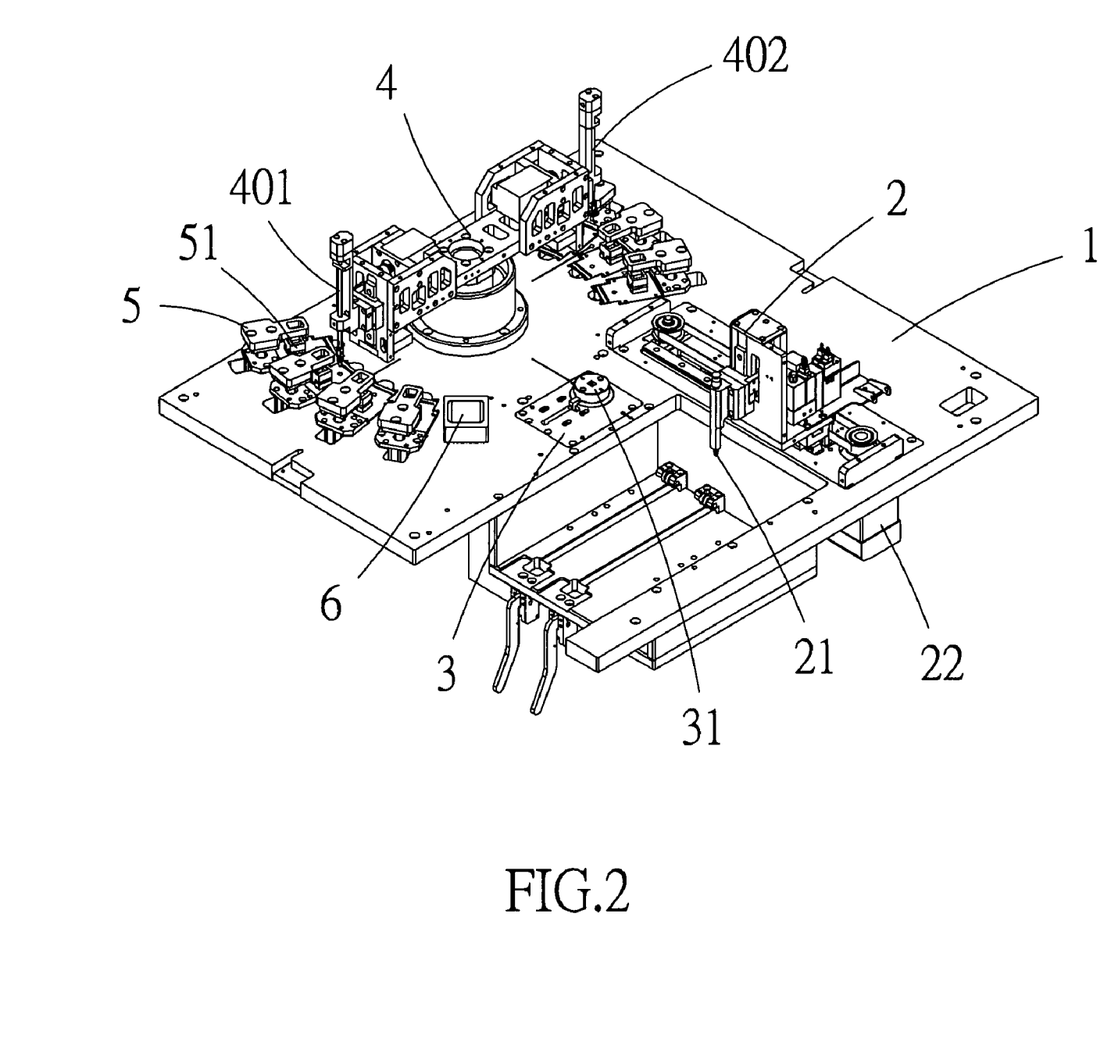
FIG. 2 is a perspective view of the IC recording device of the present invention.
Figure 3:
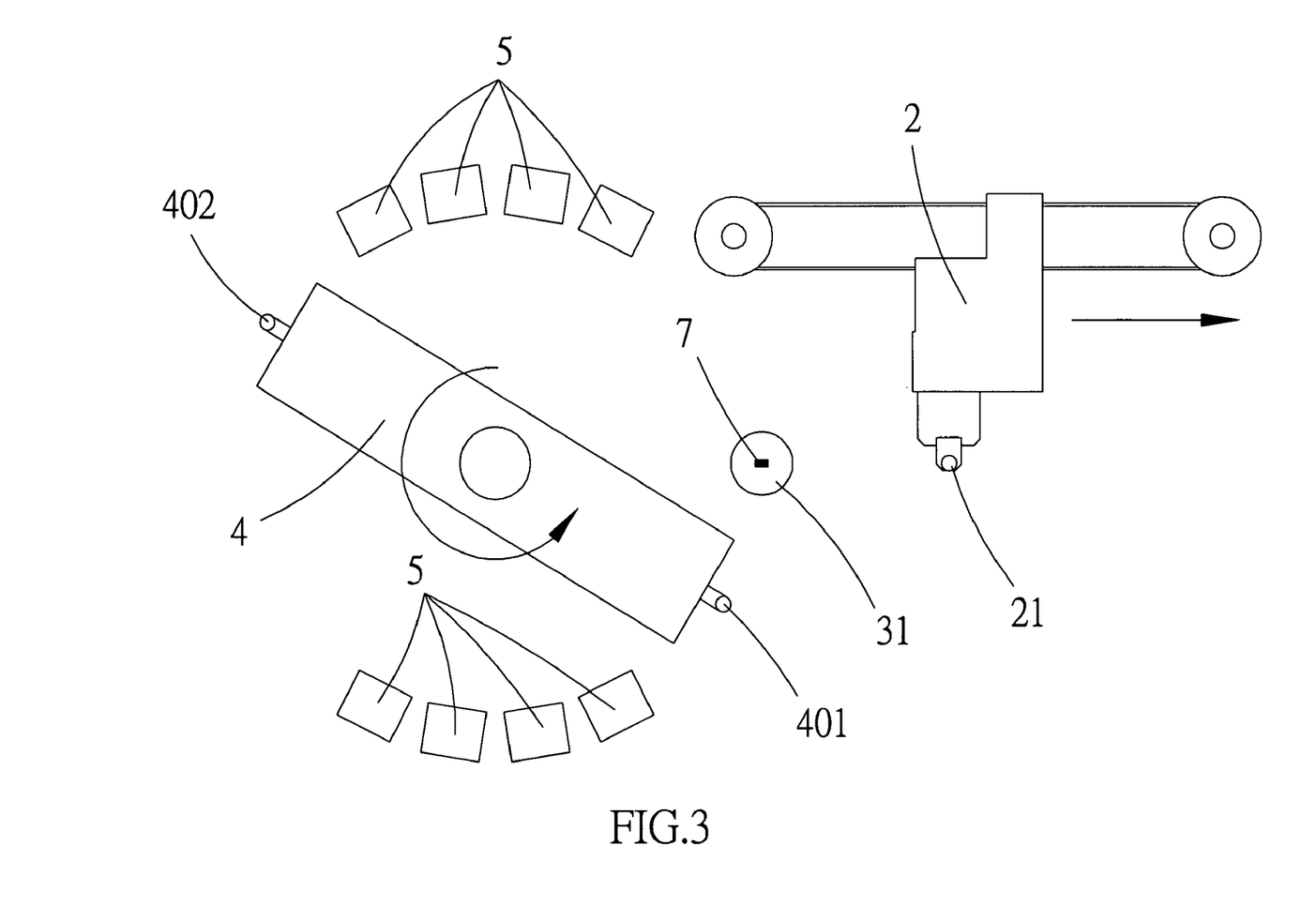
FIG. 3 shows the first operation of the rotary arm of the IC recording device of the present invention.

Referring to FIGS. 1 and 2, an IC recording device of the present invention is illustrated. The elements of the present invention will be described hereinafter.

A material feeding portion 2 has a suction nozzle 21 for taking an un-burned IC from a transfer belt by vacuum suction. The suction nozzle 21 is movable upwards and downwards for sucking an IC or placing an IC. The material feeding portion 2 is movable transversally by using a servo motor 22 below a working platform 1 to drive a belt. Thus an un-burned IC can be moved to a material receiving portion 3. The material receiving portion 3 has a material receiving seat 31 thereon. An inner side of the material receiving seat 31 has an inward sloped inclined surface. The material receiving portion 3 is rotatable for correcting the direction of the IC. If the IC is placed incorrectly, the material receiving seat 31 will rotate to correct the direction of the IC so as to assure that the pins of the IC in the burner are correctly arranged. A rotary arm 4 is installed aside the material receiving portion 3. A center of the rotary arm 4 is connected to a rotary shaft 42 passing through a lower side of the working platform. The rotary shaft 42 is driven by a servo motor 43 so that the rotary arm 4 rotates. The two ends of the rotary arm 4 have a first material transfer suction opening 401 and a second material transfer suction opening 402 which are vacuum suction openings and are movable upwards and downwards for sucking an IC. A plurality of burners 51 are installed at a lower side of the suction openings. The burners 51 can be buckled to the IC. When the burner 51 is pressed downwards, the IC can be sucked or released. When the burner 51 is not pressed, the IC in the burner 51 will be buckled. A pressing plate 5 is installed at an upper side of the burner 51. When the IC is placed or received, it will press downwards upon the burner 51 so that the IC can be placed in the burner 51 successfully for recording. The suction opening at one end of the rotary arm 4 place the ICs on the same side of the burners 51. The suction opening at another end of the rotary arm 4 places the IC on the transfer belt for transferring a recorded IC. The rejected product will be placed in a waste frame 6 by using the rotary arm 4.

Referring to FIGS. 3, 3-1, 3-2, 3-3 and 3-4, the actions (1) to (5) of the present invention are illustrated. When an IC 7 is place upon a material receiving seat 31, the first material transfer suction opening 401 of the rotary arm 4 will rotate toward the material receiving seat 31 for sucking an un-recorded IC 7. The material feeding portion 2 will move rightwards for sucking another un-recorded IC 7. When the first material transfer suction opening 401 sucks an un-recorded IC 7, the material feeding portion 2 will move to the upper side of the material receiving seat 31 and place the IC 7 on the suction opening to the material receiving seat 31. The process is repeated continuously until every burner 51 on one side has located an IC 7 for recording by using the first material transfer suction opening 401. At the time that the first material transfer suction opening 401 sucks an IC 7 for locating the IC 7 at another side, the second material transfer suction opening 402 at another end of the rotary arm 4 sucks a recorded IC 7 and the first material transfer suction opening 401 re-sucks an IC 7 on the material receiving seat 31, the recorded IC 7 is placed upon a transfer belt 8. The operations of recording and transferring are performed repeatedly.

Figure 4:
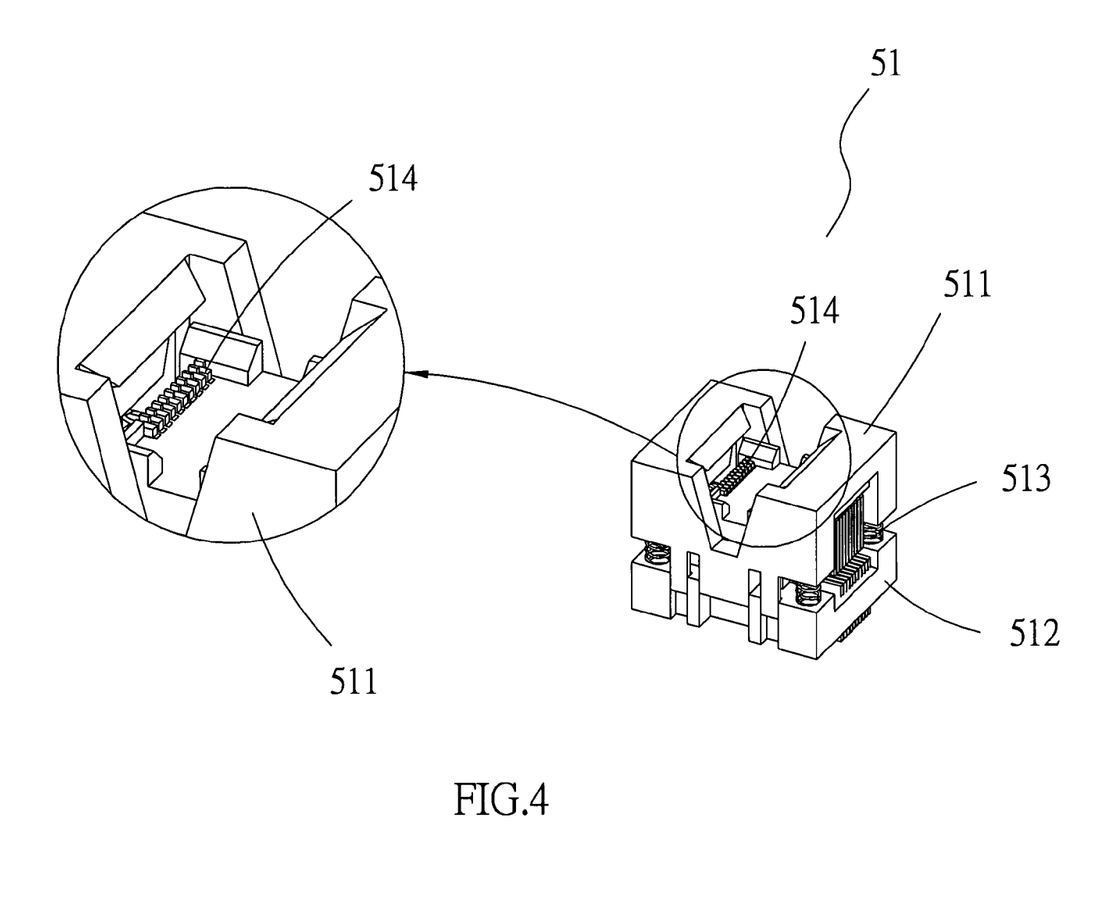
FIG. 4 is a schematic view showing a clamping operation of the burner of the IC recording device according to the present invention.
Figure 41:
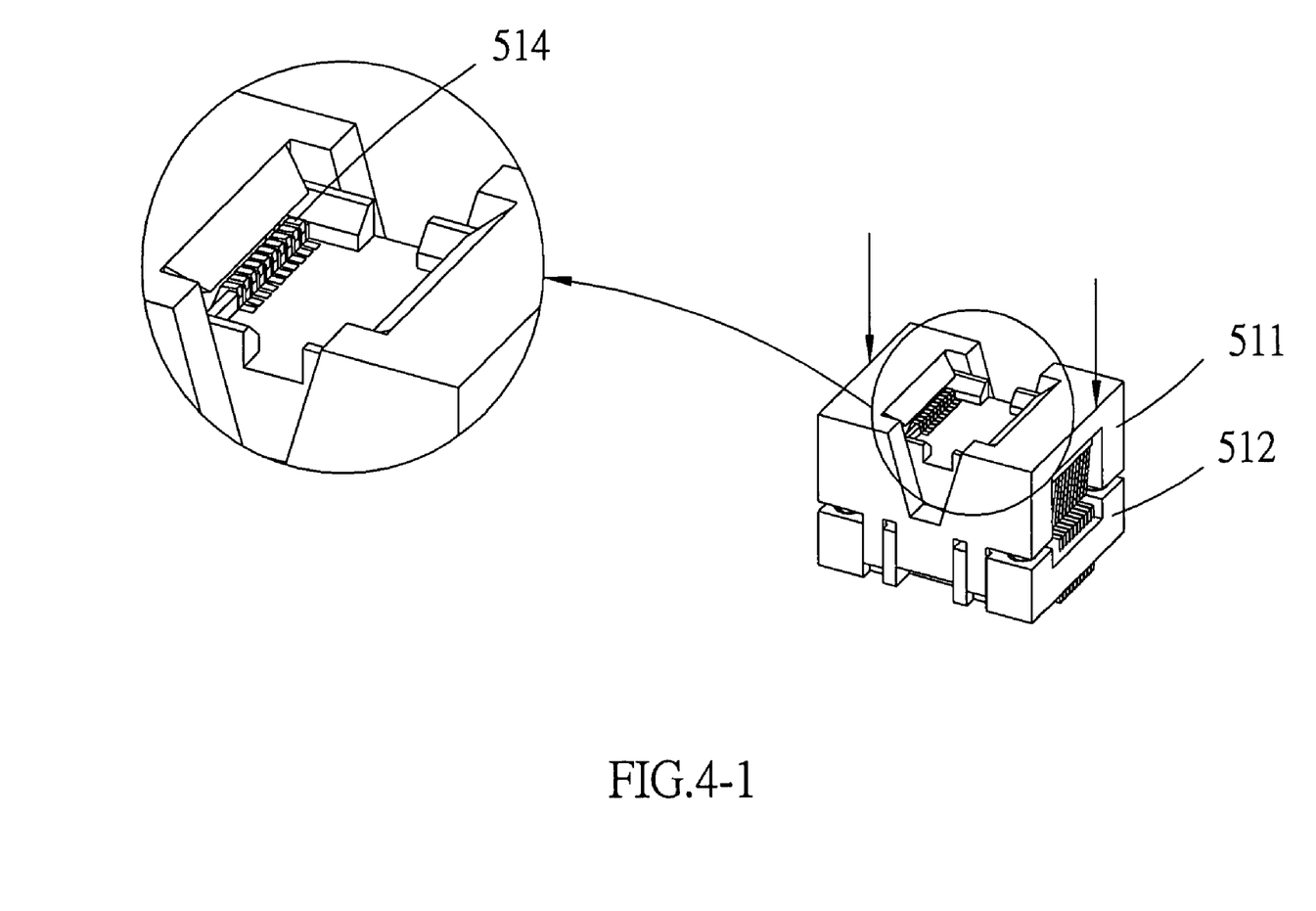

Referring the FIG. 4 and FIGS. 4-1, the burner 51 is formed by a movable seat 511 and a bottom seat 512. A spring 513 is used to connect the movable seat 511 and the bottom seat 512. When the movable seat 511 is pressed, the movable seat 511 has a space for moving downwards. The movable seat 511 is installed with a metal joint 514 for recording an IC 7. The metal joint 514 is movable. When the movable seat 511 moves downwards, the metal joint 514 will move backwards. When the movable seat 511 returns, the metal joint 514 returns and clamps the pins of the IC 7 to clamp the IC 7. When it wants to place the IC 7 on a burner 51, the pressing plate 5 at the upper side of the burner 51 will move downwards automatically so that IC 7 can be place upon the burner 51. Then, the burner 51 stops to press the burner 51. The movable seat 511 of the burner 51 returns and the metal joint 514 clamps the IC 7 to be recorded. After recording, the pressing plate 5 presses the burner 51 again so that the suction opening can suck the IC 7 and then the pressing plate 5 and the burner 51 return.

Figure 5:
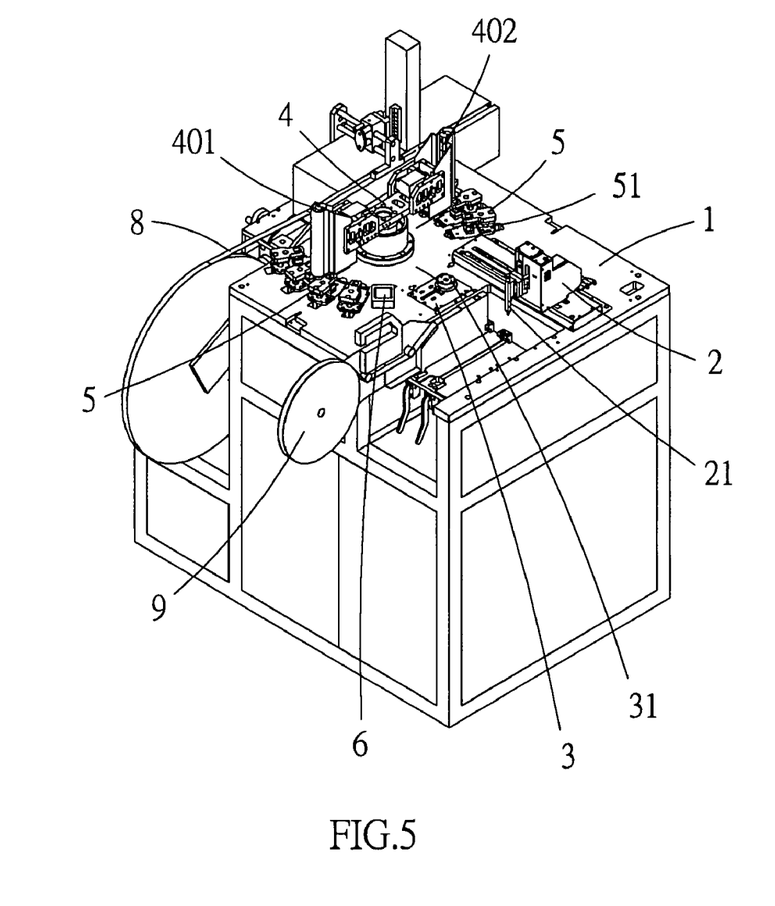
FIG. 5 shows the operation of the IC recording device of the present invention.
Figure 31:
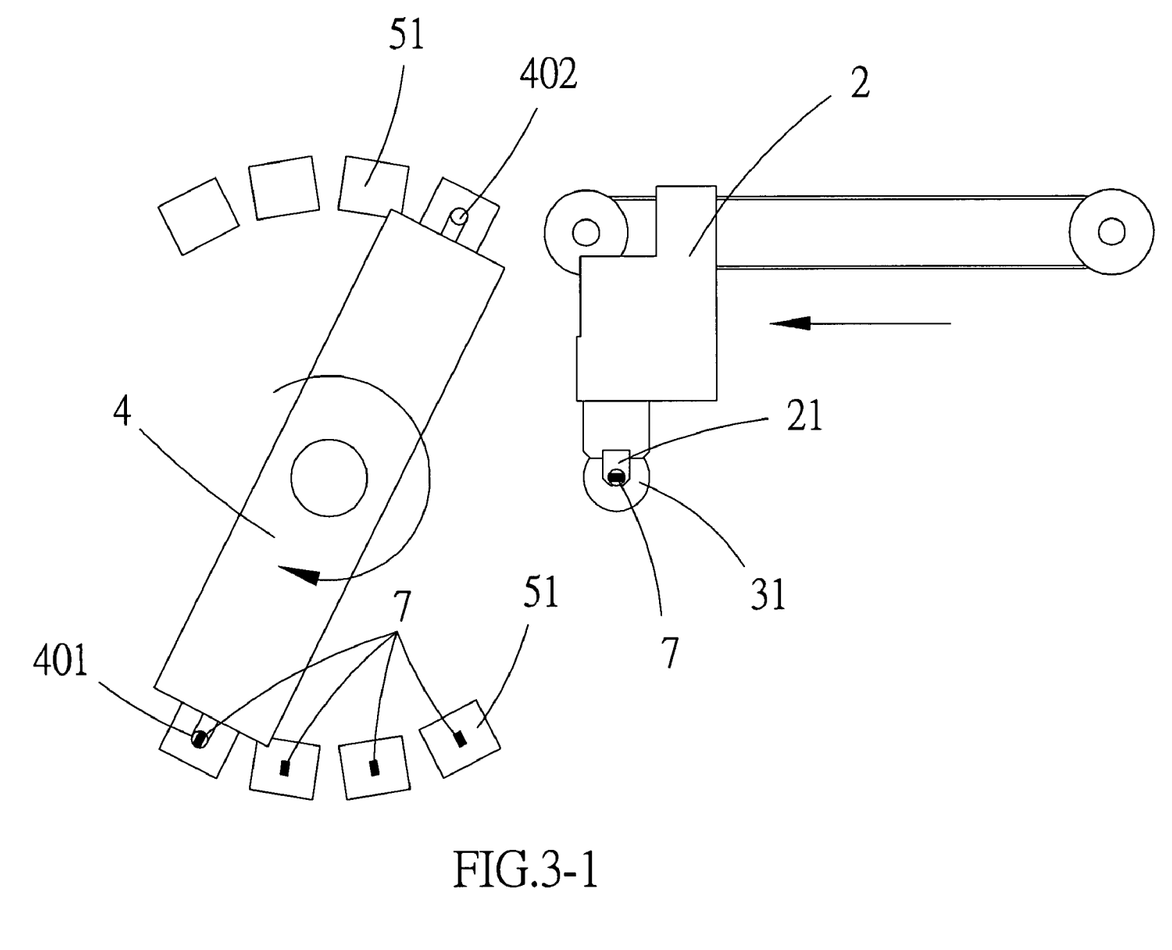
Figure 32:
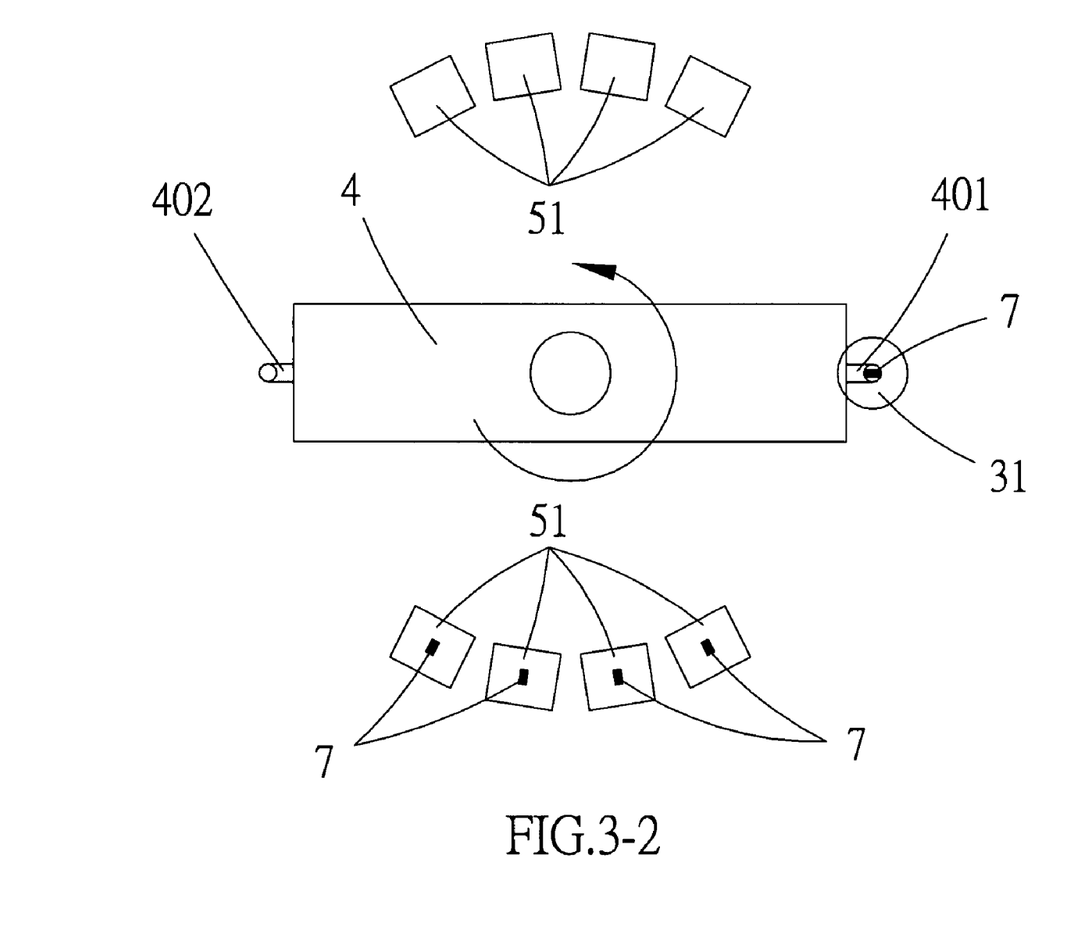
Figure 33:
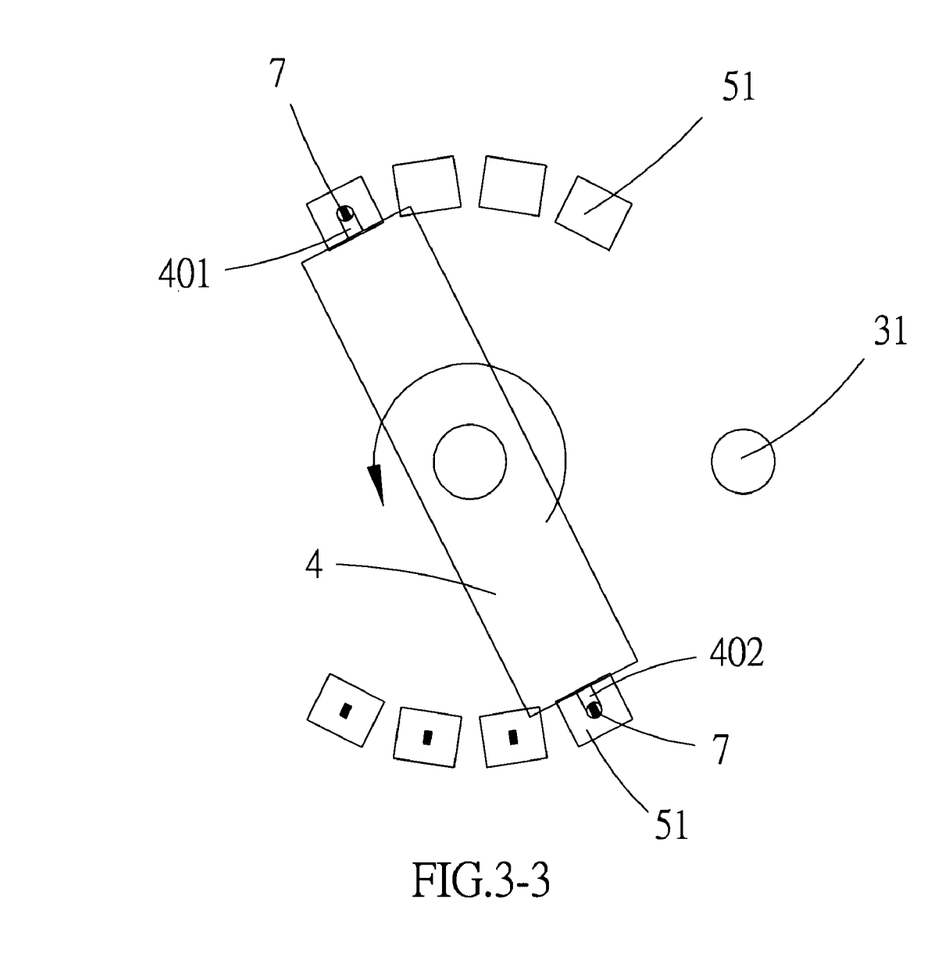
Figure 34:
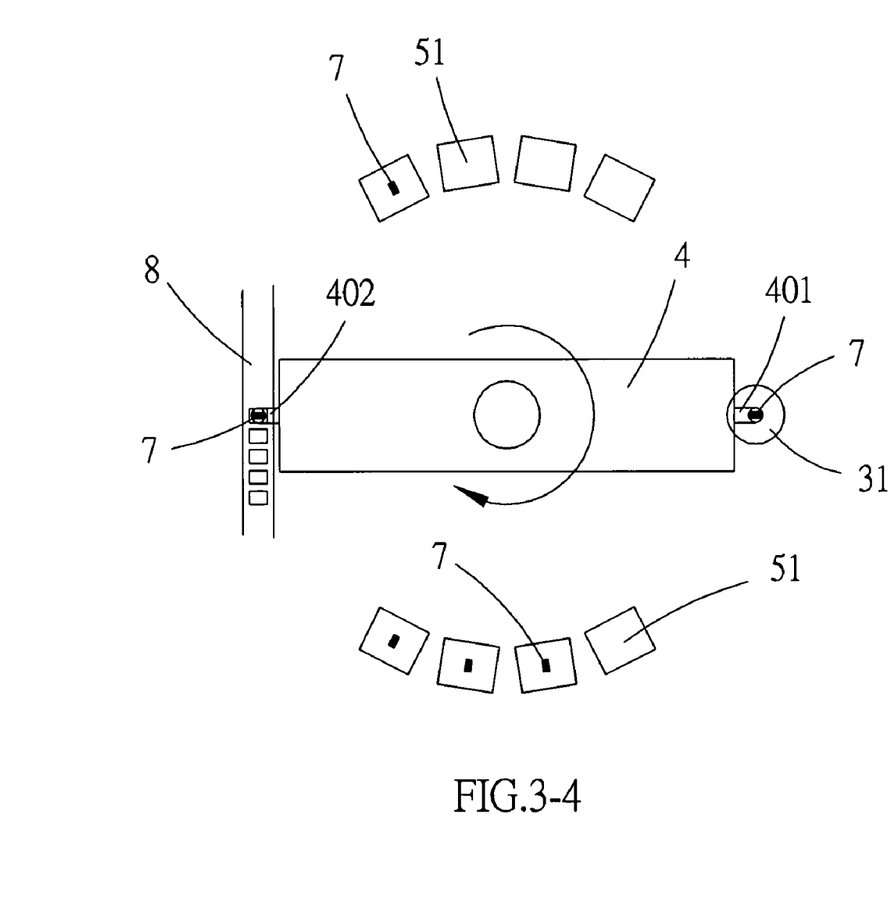

Referring to FIG. 5, it is illustrated that the transfer belt 9 feeds un-recorded ICs 7 to the material feeding portion 2 continuously to be sucked by the suction openings. The material feeding portion 2 will move the ICs 7 to the material receiving portion 3. If the position of the IC 7 is unaligned, the material receiving seat 31 will rotate automatically to correct the IC 7. Then, the first material transfer suction opening 401 and the second material transfer suction opening 402 on the rotary arm 4 will feed un-recorded ICs 7 to the burner 51 and transfer recorded ICs 7 to the transfer belt 8. Thus, the ICs 7 can be recorded quickly with high speeds.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An IC recording device comprising:
 a material feeding portion having a suction nozzle for taking an un-burned IC from a transfer belt by vacuum suction; the suction nozzle being movable for sucking an IC or placing an IC; the material feeding portion being movable transversally by using a servo motor below a working platform to drive a belt; thus an un-burned IC can be moved to a material receiving portion;
 the material receiving portion having a material receiving seat thereon; the material receiving portion being rotatable for correcting the direction of the IC; if the IC is placed incorrectly, the material receiving seat will rotate to correct the direction of the IC so as to assure that pins of the IC in the burner are correctly arranged; a rotary arm being installed aside the material receiving portion;
 a plurality of pressing plates and burners; the burners serving for locating an IC; and the pressing plates serving for pressing the burners; and
 a rotary arm being driven by a servo motor; two ends of the rotary arm having a first material transfer suction opening and a second material transfer suction opening; wherein when an IC is placed upon the material receiving seat, the first material transfer suction opening of the rotary arm will rotate toward the material receiving seat for sucking an un-recorded IC; the material feeding portion will move rightwards for sucking another un-recorded IC; when the first material un-recorded IC, the material feeding portion will move to the upper side of the material receiving seat and place the IC on the suction opening to the material receiving seat; the process being repeated continuously until every burner on one side has located an IC for recording by using the first material transfer suction opening; at the time that the first material transfer suction opening sucks an IC for locating the IC at another side, the second material transfer suction opening at another end of the rotary arm sucks a recorded IC and the first material transfer suction opening re-sucks an IC on the material receiving seat, the recorded IC is placed upon a transfer belt; the operations of recording and transferring are performed repeatedly.

2. The IC recording device as claimed in claim 1, wherein the suction nozzle, first material transfer suction opening and second material transfer suction opening suck an object by vacuum suction.

3. The IC recording device as claimed in claim 1, wherein when the burner presses downwards, the IC can be sucked or released; when the burner is not pressed, the IC in the burner will be clamped; a pressing plate is installed at an upper side of the burner; when the IC is placed or received, it will press downwards upon the burner so that the IC can be placed in the burner successfully for recording.

4. An IC recording device comprising:

a material feeding portion having a suction nozzle for taking an un-burned IC from a transfer belt by vacuum suction; the suction nozzle being movable for sucking an IC or placing an IC; the material feeding portion being movable transversally by using a servo motor below a working platform to drive a belt; thus an un-burned IC can be moved to a material receiving portion;

the material receiving portion having a material receiving seat thereon; the material receiving portion being rotatable for correcting the direction of the IC; if the IC is placed incorrectly, the material receiving seat will rotate to correct the direction of the IC so as to assure that pins of the IC in the burner are correctly arranged; a rotary arm is installed aside the material receiving portion;

a plurality of pressing plates and burners; the burners serving for locating an IC; and the pressing plates serving for pressing the burners; and a rotary arm being driven by a servo motor; two ends of the rotary arm having a first material transfer suction opening and a second material transfer suction opening; wherein when an IC is placed upon the material receiving seat, the first material transfer suction opening of the rotary arm will rotate toward the material receiving seat for sucking an un-recorded IC; the material feeding portion will move rightwards for sucking another un-recorded IC; when the first material transfer suction opening sucks an un-recorded IC, the material feeding portion will move to the upper side of the material receiving seat and place the IC on the suction opening to the material receiving seat; the process is repeated continuously until every burner on one side has located an IC for recording by using the first material transfer suction opening; the second material transfer suction opening starts to suck the first IC to be recorded until all the recorded ICs have been transferred to the transfer belt, then the first material transfer suction opening sucks and places ICs on the burners; the process is repeated continuously.

\* \* \* \* \*